US010078105B2

(12) United States Patent
Schneider et al.

(10) Patent No.: US 10,078,105 B2
(45) Date of Patent: Sep. 18, 2018

(54) ELECTRICAL SYSTEM WITH ARC FAULT DETECTION

(71) Applicant: ABB Technology Ltd., Zurich (CH)

(72) Inventors: Patrick Erik Schneider, Saint Paul, MN (US); Jing Xu, Cary, NC (US)

(73) Assignee: ABB Schweiz AG, Baden (CH)

( * ) Notice: Subject to any disclaimer, the term of this patent is extended or adjusted under 35 U.S.C. 154(b) by 144 days.

(21) Appl. No.: 14/862,716

(22) Filed: Sep. 23, 2015

(65) Prior Publication Data

US 2017/0082672 A1    Mar. 23, 2017

(51) Int. Cl.

| | |
|---|---|
| *G01R 31/26* | (2014.01) |
| *G01R 31/02* | (2006.01) |
| *H03H 11/12* | (2006.01) |
| *G01R 19/165* | (2006.01) |
| *H02S 50/10* | (2014.01) |

(52) U.S. Cl.
CPC ......... *G01R 31/024* (2013.01); *G01R 19/165* (2013.01); *H02S 50/10* (2014.12); *H03H 11/1217* (2013.01)

(58) Field of Classification Search
CPC ............ G01R 31/2884; G01R 31/3004; G01R 31/31715; G01R 31/31701; G01R 31/2605; G01R 31/405; G01R 31/02; G01R 31/2829; G01R 31/14; G01R 31/088; G01R 31/025; G01R 31/083; G01R 31/28; G01R 31/1272; G01R 31/1254; G01R 31/31924;

(Continued)

(56) References Cited

U.S. PATENT DOCUMENTS 4,466,071 A * 8/1984 Russell, Jr. .......... H02H 1/0015
324/520
5,359,293 A   10/1994 Boksiner et al.
(Continued)

FOREIGN PATENT DOCUMENTS

WO    2011017721    2/2011

OTHER PUBLICATIONS

AN-2154 SolarMagic RD-195 DC Arc Detection Evaluation board (Rev. E), available at http://www.ti.com/lit/htm/snoa564, Oct. 5, 2012, 29 pgs.

(Continued)

*Primary Examiner* — Thang Le
(74) *Attorney, Agent, or Firm* — Taft Stettinius & Hollister LLP

(57) ABSTRACT

A unique electrical system includes a first electrical component and a second electrical component. A conductor electrically couples the first electrical component with the second electrical component. A sensor is constructed to sense an AC power flow in the conductor and output an AC signal proportional to the AC power flow. A band-pass filter is in electrical communication with the sensor and constructed to receive and filter the AC signal and to generate an AC voltage proportional on the AC signal. A controller is in electrical communication with the band-pass filter, and is operative to receive and sample the AC voltage. The controller is configured to execute program instructions to sum sequential AC voltage values received from the band-pass filter over a sample time period, and to determine whether an arc fault has occurred based on the summed AC voltage values.

18 Claims, 5 Drawing Sheets

(58) Field of Classification Search
CPC ........ G01R 31/31922; G01R 31/31937; G01R 31/2603
USPC ........ 324/761.01, 750.3, 511, 512, 521, 522, 324/531, 536, 537, 750.01; 361/42, 45, 361/49
See application file for complete search history.

(56) References Cited

U.S. PATENT DOCUMENTS

| | | | |
|---|---|---|---|
| 5,578,931 A * | 11/1996 | Russell | H02H 1/0015 324/536 |
| 5,933,305 A * | 8/1999 | Schmalz | H02H 1/0015 361/115 |
| 6,577,138 B2 | 6/2003 | Zuercher et al. | |
| 6,594,125 B2 | 7/2003 | Dollar, II | |
| 7,151,656 B2 | 12/2006 | Dvorak et al. | |
| 7,190,561 B2 | 3/2007 | Pellon et al. | |
| 7,463,465 B2 * | 12/2008 | Rivers | H02H 1/0015 361/42 |
| 7,812,592 B2 | 10/2010 | Prior et al. | |
| 7,952,843 B2 | 5/2011 | Potter | |
| 8,179,147 B2 | 5/2012 | Dargatz et al. | |
| 8,576,520 B2 | 11/2013 | Pamer et al. | |
| 8,599,523 B1 | 12/2013 | Ostrovsky | |
| 2002/0149891 A1 | 10/2002 | Neiger et al. | |
| 2003/0002694 A1 | 1/2003 | Thiele | |
| 2003/0072113 A1 * | 4/2003 | Wong | H02H 1/0015 361/5 |
| 2004/0027749 A1 * | 2/2004 | Zuercher | H02H 1/0015 361/62 |
| 2004/0042137 A1 | 3/2004 | Wonk et al. | |
| 2005/0057261 A1 * | 3/2005 | Hale | G01R 31/025 324/536 |
| 2006/0212235 A1 * | 9/2006 | Kolker | G01R 31/025 702/58 |
| 2010/0020451 A1 * | 1/2010 | Changali | H02H 1/0015 361/42 |
| 2011/0141644 A1 | 6/2011 | Hastings et al. | |
| 2013/0092208 A1 * | 4/2013 | Robbins | H01L 31/02021 136/244 |
| 2014/0104731 A1 * | 4/2014 | Kolker | G01R 31/025 361/42 |
| 2014/0168843 A1 * | 6/2014 | Privitera | G01R 31/025 361/93.1 |
| 2014/0347069 A1 * | 11/2014 | Krumpholz | G01R 31/025 324/541 |
| 2016/0006481 A1 * | 1/2016 | Rendusara | F04D 1/06 340/854.9 |

OTHER PUBLICATIONS

Search Report and Written Opinion, PCT Appln. No. PCT/US16/53322, dated Dec. 16, 2016, 9 pgs.

* cited by examiner

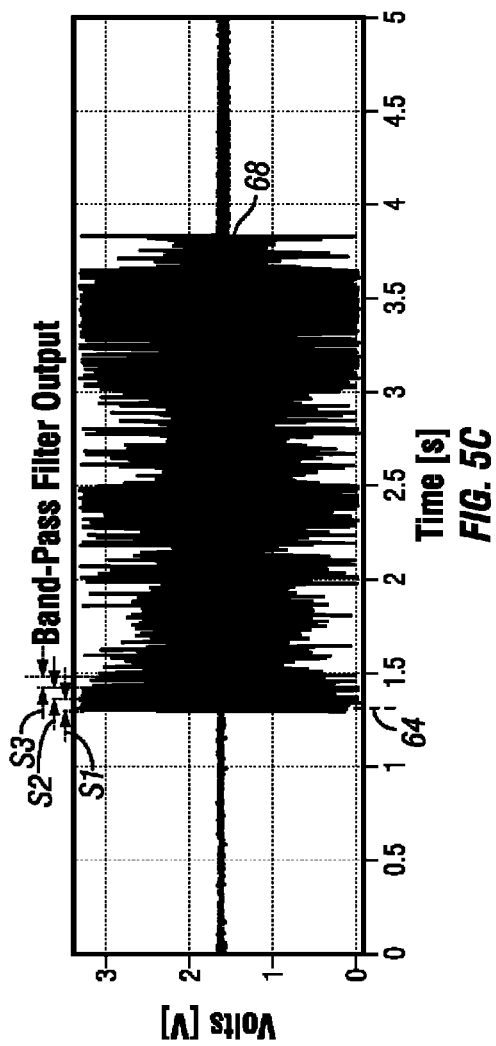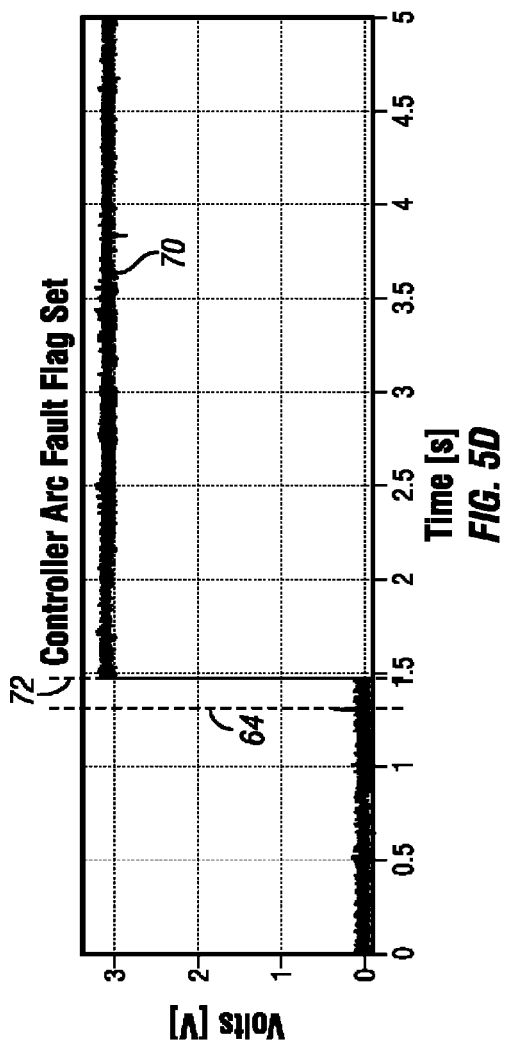

ELECTRICAL SYSTEM WITH ARC FAULT DETECTION

FIELD OF THE INVENTION

The present invention relates to electrical systems, and more particularly to electrical systems having arc fault detection systems.

BACKGROUND

Electrical systems of various types, e.g., photovoltaic and other electrical systems remain an area of interest. Some existing systems have various shortcomings, drawbacks and disadvantages relative to certain applications. For example, in some electrical systems, undesirable arc faults may occur in one or more of various locations throughout the electrical system. Accordingly, there remains a need for further contributions in this area of technology.

SUMMARY

Embodiments of the present invention include a unique electrical system. The electrical system includes a first electrical component and a second electrical component. A conductor electrically couples the first electrical component with the second electrical component. A sensor is constructed to sense an AC power flow in the conductor and output an AC signal proportional to the AC power flow. A band-pass filter is in electrical communication with the sensor and constructed to receive and filter the AC signal and to generate an AC voltage proportional on the AC signal. A controller is in electrical communication with the band-pass filter, and is operative to receive and sample the AC voltage. The controller is configured to execute program instructions to sum sequential AC voltage values received from the band-pass filter over a sample time period, and to determine whether an arc fault has occurred based on the summed AC voltage values.

BRIEF DESCRIPTION OF THE DRAWINGS

The description herein makes reference to the accompanying drawings wherein like reference numerals refer to like parts throughout the several views, and wherein:

FIGS. 5A-5D are plots depicting some aspects of the operation of an arc fault detection system in accordance with a non-limiting example of an embodiment of the present invention.

DETAILED DESCRIPTION

Figure 1:
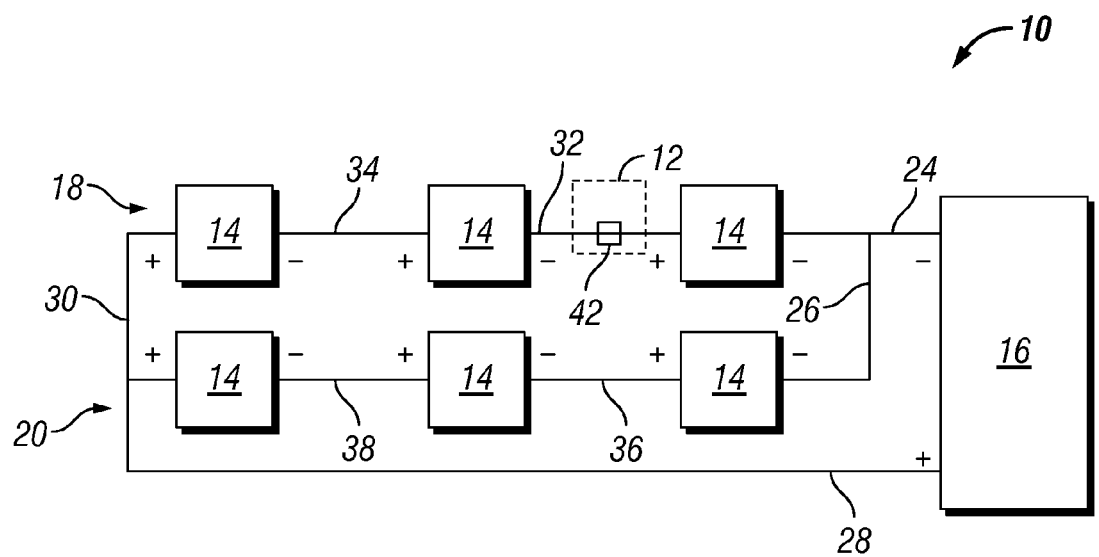
FIG. 1 schematically depicts some aspects of an electrical system in accordance with a non-limiting example of an embodiment of the present invention.

For purposes of promoting an understanding of the principles of the invention, reference will now be made to the embodiments illustrated in the drawings, and specific language will be used to describe the same. It will nonetheless be understood that no limitation of the scope of the invention is intended by the illustration and description of certain embodiments of the invention. In addition, any alterations and/or modifications of the illustrated and/or described embodiment(s) are contemplated as being within the scope of the present invention. Further, any other applications of the principles of the invention, as illustrated and/or described herein, as would normally occur to one skilled in the art to which the invention pertains, are contemplated as being within the scope of the present invention.

Referring to the drawings, and in particular FIG. 1, some aspects of a non-limiting example of an electrical system 10 in accordance with an embodiment of the present invention are schematically depicted. In one form, electrical system 10 is a DC photovoltaic (PV) system, e.g., a PV power generation system. In other embodiments, electrical system 10 may take other forms. Electrical system 10 includes a plurality of electrical components and at least one arc fault detection system 12. In one form, the electrical components include solar panels 14 and an inverter 16. The number of solar panels and inverters may vary with the needs of the particular application.

In one form, solar panels 14 are arranged in a plurality of strings 18, 20, wherein the solar panels in each string are arranged in series with respect to each other, and the strings 18, 20 are arranged in parallel with respect to each other. In other embodiments, other series and/or parallel arrangements may be employed. In other embodiments, electrical system 10 may include other types of electrical components in addition to or in place of solar panels 14 and inverter 16. In the illustrated embodiment, solar panels 14 are electrically coupled with inverter 16 via conductors 24, 26, 28 and 30; and are electrically coupled with each other via conductors 26, 30, 32, 34, 36 and 38. In other embodiments, other electrical connections may be employed as between solar panels 14 and inverter 16.

During the operation of various types of electrical systems, including PV systems, an arcing fault or arc fault can potentially occur for one or more of a plurality of reasons. Arc faults can occur in various locations and under certain circumstances, such as between portions of a damaged conductor or between a conductor and another conductor operating a different potential difference, as well as in contacts, connections, and at locations between a conductor and ground, to name a few examples. Types of arc faults include series arc faults and parallel arc faults. For example, series arc faults can take place across a gap between the ends of a broken or damaged conductor. The damage may stem from one or more sources, e.g., physical damage, corrosion, overloading such as by voltage spikes, e.g., caused by lightning, or other sources. Series arc faults can also take place at other locations where the conductive path is opened, and the breakdown voltage for the gap has been exceeded. Other examples include arcing events at a loose, failed or failing contact or connection, between loosened, failed or failing or inadequately secured conductors or connectors, etc. For example, a contact point or connector may become loosened over the course of time due to temperature fluctuations, corrosion, improper installation, aging and the like. Parallel arcs can occur between two conductors at different potential, between a conductor or ground or at other locations where conditions conducive to arcing exist, e.g., damaged insulation, damaged conductors, installation errors, fastener penetration of insulation and the like.

Figure 2:
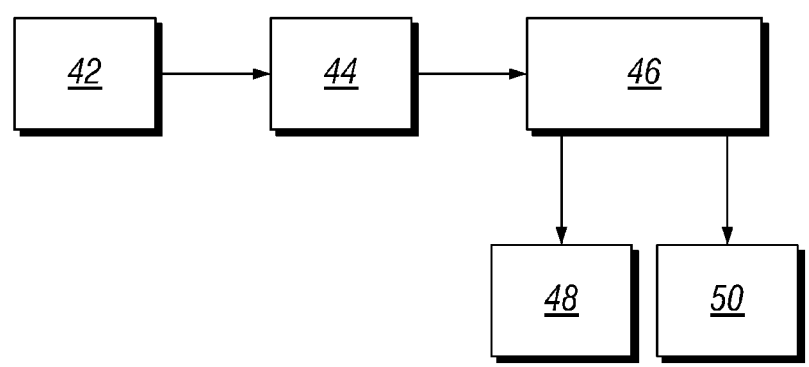
FIG. 2 schematically illustrates some aspects of an arc fault detection system in accordance with a non-limiting example of an embodiment of the present invention.

Referring to FIG. 2, some aspects of a non-limiting example of arc fault detection system 12 in accordance with an embodiment of the present invention are schematically depicted. Arc fault detection system 12 operates in the time domain. Arc fault detection system 12 is configured to determine whether an arc fault or arcing fault is occurring in electrical system 10, and in some embodiments, to initiate or take corrective measures to terminate or otherwise control the arc faults. Arc fault detection system 12 includes a sensor 42, a band-pass filter 44 and a controller 46. Sensor 42 is constructed to sense the AC power flow in a conductor, and to output an AC signal proportional to the AC power flow. Arc fault detection system 12 is operative to determine the presence of an arc fault condition, and to provide a signal, e.g., set an arc fault flag, that may be used to take corrective action against the arc fault. In some embodiments, arc fault detection system 12 initiates corrective action, e.g., by controlling a circuit interrupter, a shunt device, or one or more other devices or systems that terminate, mitigate or otherwise control an arc fault condition.

In the illustration of FIG. 1, sensor 42 is illustrated at being disposed at, adjacent to or around conductor 32 and configured to sense AC power flow in conductor 32. In other embodiments, one or more current sensors 32 may be disposed at, adjacent to or around any or each of conductors 24, 26, 28, 30, 32, 34, 36 and 38, or at other suitable locations. In some embodiments, an arc fault detection system 12 may be disposed at and operate respective to AC power flow in any or all of conductors 24, 26, 28, 30, 32, 34, 36 and 38, or at any other suitable locations. In some embodiments, arc fault detection system 12 may include additional components that may be utilized to terminate, mitigate or otherwise control an arc fault, e.g., one or more circuit interrupters 48 and/or one or more shunts 50, e.g., a ground shunt or a shunt operative to bypass one or more portions of electrical system 10, e.g., a solar panel 14. In other embodiments, other electrical components may be used in addition to or in place of interrupter 48 or shunt 50 to control or terminate, mitigate or otherwise control an arc fault. As a circuit interrupter, in some embodiments, interrupter(s) 48 may be positioned and constructed to interrupt current flow in a desired one or more conductors, e.g., conductor 32 and/or one or more conductors.

In one form, sensor 42 is a high frequency current transformer constructed to measure or sense AC current flow in the associated conductor, e.g., conductor 32, and to output an AC signal that is proportional to the AC current flow in conductor 32. In other embodiments, sensor 42 may take one or more other forms in addition to or in place of a current transformer. For example, in some embodiments, sensor 42 may be a Hall Effect sensor, a Rogowski coil or another type of sensor configured to sense AC current and/or AC voltage in the conductor. In one form, sensor 42 has a usable bandwidth of 50 kHz to 500 kHz. In other embodiments, other bandwidths may be employed.

Figure 3:
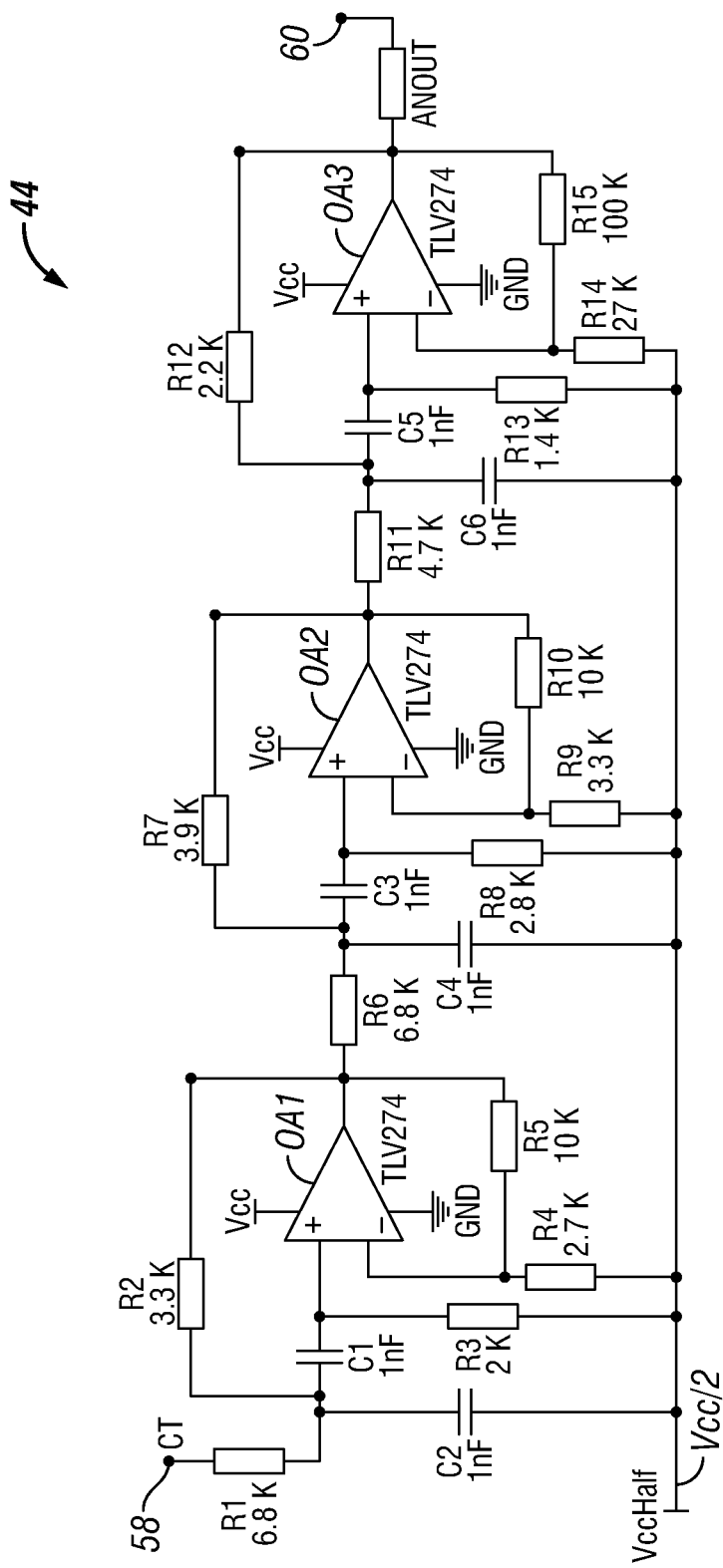
FIG. 3 schematically illustrates some aspects of a band-pass filter in accordance with a non-limiting example of an embodiment of the present invention.

Referring to FIG. 3, some aspects of a non-limiting example of band-pass filter 44 in accordance with an embodiment of the present invention are schematically depicted. Band-pass filter 44 is in electrical communication with sensor 42 and operative to filter the output of sensor 42. Band-pass filter 42 is constructed to receive the AC signal from sensor 42, filter the AC signal, and to generate an AC voltage that is proportional to the AC signal. Band-pass filter 44 is constructed to pass AC signals in frequency ranges associated with arc faults, whereby the AC voltage generated by band-pass filter 44 is at the frequencies associated with arcing, and other frequencies are attenuated or otherwise not passed. In one form, band-pass filter 44 is a series analog band-pass filter. In other embodiments, filter 44 may be digital and/or parallel in form. In one form, band-pass filter 44 is a three Sallen-Key band-pass filter. In a particular form, band-pass filter 44 is a sixth order, three Sallen-Key band-pass filter. In other embodiments, band-pass filter 44 may take one or more other forms.

The non-limiting example band-pass filter 44 illustrated in FIG. 3 includes three operational amplifiers OA1, OA2 and OA3. An example of a suitable operational amplifier is a model TLV274 operational amplifier, commercially available Texas Instruments Incorporated of Dallas, Tex., USA. The non-limiting example band-pass filter 44 also includes resistors R1, R2, R3, R4, R5, R6, R7, R8, R9, R10, R11, R12, R13, R14 and R15, which in the non-limiting example of FIG. 3 have resistance values of 6.8 kΩ, 3.3 kΩ, 2 kΩ, 2.7 kΩ, 10 kΩ, 6.8 kΩ, 3.9 kΩ, 2.8 kΩ, 3.3 kΩ, 10 kΩ, 4.7 kΩ, 2.2 kΩ, 1.4 kΩ, 27 kΩ and 100 kΩ, respectively. The non-limiting example band-pass filter 44 further includes capacitors C1, C2, C3, C4, C5 and C6, each of which in the non-limiting example of FIG. 3 has a capacitance value of 1 nF. The numbers of and electrical characteristics of the operational amplifiers, resistors and capacitors may vary with the needs of the particular applications, e.g., the frequencies desired to be passed through the filter. In addition, in some embodiments, other electrical components may be employed in band-pass filter 44 in addition to or in place of at least some those mentioned herein.

Figure 4:
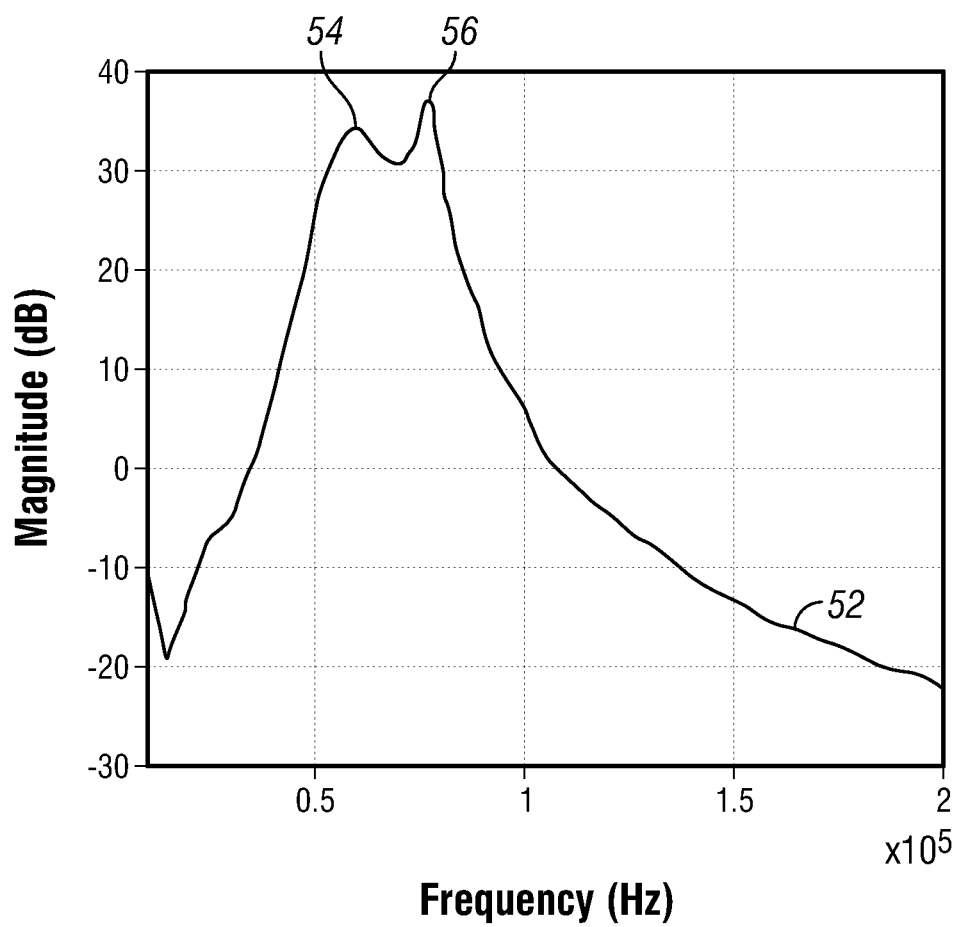
FIG. 4 depicts some aspects of a band-pass filter transfer function in accordance with a non-limiting example of an embodiment of the present invention.

In one form, band-pass filter 44 is a high order band-pass filter constructed or tuned to yield a high pass band ripple to have multiple peaks, e.g., at 66 kHz and 77 kHz, as illustrated in the non-limiting example of a measured transfer function 52 of band-pass filter 44 having two peaks 54, 56 in FIG. 4, as opposed to a "flat" top. The tuning is achieved, for example, by selecting the resistance and capacitance values of R1-R15 and C1-C6, and the characteristics of the operational amplifiers OA1-OA3 in the non-limiting example of FIG. 3, as well as the numbers, locations and characteristics of resistors, capacitors and other electrical components in various embodiments. In some embodiments, the use of multiple peaks may allow greater sensitivity to frequencies associated with arc faults. Band-pass filter 44 is in electrical communication with sensor 42 via a node 58, which is a current transducer (CT) input to band-pass filter 44. Band-pass filter 44 is in electrical communication with controller 46 via a node 60, which is an analog output (ANOUT) of band-pass filter 44.

Controller 46 is in electrical communication with band-pass filter 44. Controller 46 is operative to receive and digitally sample the filtered current, e.g., the AC voltage from, i.e., output by, band-pass filter 44. In some embodiments, controller 46 may include an analog-to-digital converter for digitally sampling the output of band-pass filter 44. In other embodiments, an analog-to-digital converter may be disposed electrically between band-pass filter 44 and controller 46. In other embodiments, no analog-to-digital converter may be employed and/or other internal and/or external features may be used to aid controller 46 in digitally sampling the output of band-pass filter 44. In one form, the output of band-pass filter 44 is digitally sampled at a significantly lower rate than the bandwidth of the filter in order to avoid nuisance tripping, e.g., due to inverter noise during startup. In a particular form, the output of band-pass filter 44 is digitally sampled at a rate that is approximately an order of magnitude lower than the bandwidth of band-pass filter 44.

In one form, controller 46 is microprocessor based and is operative to execute program instructions in the form of software stored in a memory (not shown) and/or firmware.

However, it is alternatively contemplated that the controller and program instructions may be in the form of any combination of software, firmware and hardware, including state machines, and may reflect the output of discreet devices and/or integrated circuits, which may be co-located at a particular location or distributed across more than one location, including any digital and/or analog devices configured to achieve the same or similar results as a processor-based controller executing software or firmware based instructions.

Controller 46 is configured to execute program instructions to sum sequential AC voltage values received from band-pass filter 44 over a sample time period; and to determine whether an arc fault has occurred based on the summed AC voltage values. Digitally, a sum of the sampled and filtered current (in the form of the AC voltage data output by band-pass filter 44) is obtained by controller 46 for a desired number of sample periods in some embodiments. The number of sample periods may vary with the needs of the application, and in various embodiments may be a single sample period or may be any greater number of sample periods, including continuous sampling through repeated sample time periods during the operation of electrical system 10 and arc detection system 12. The resulting summed voltage values are further processed to indicate if there is an arcing fault in electrical system 10, and in some embodiments, between electrical system 10 and ground. In some embodiments, a flag is set to indicate an arc fault, which is used to take corrective action, e.g., terminate, mitigate or otherwise control the arc fault.

In some embodiments, the filtering of the AC signal in band-pass filter 44 is referenced to a virtual ground at Vcc/2 (wherein Vcc is the power supply voltage for band-pass filter 44), because in such embodiments, controller 46 employs a range of 0-Vcc for sampling the voltage output of band-pass filter 44. The virtual ground reference is employed in order to capture the full polarity of the voltage signal. In other embodiments, other ground references may be used. Once the AC voltage output of band-filter 44 is sampled by controller 46, the offset of the virtual ground is removed to obtain signed voltage values, that is, a positive and negative voltage values. In embodiments wherein sensor 42 provides a bipolar output, e.g., the bipolar output of a current transducer, controller 46 executes program instructions to take the absolute values of the signed voltage values, and then executes program instructions to sum sequential absolute values.

In various embodiments, the sequential absolute voltage values may be summed for a desired sample time period (sample length) to obtained sum-sampled values. In some embodiments, the sequential absolute voltage values may be summed for a plurality of desired sample time periods, e.g., repeatedly summing the sequential AC voltage values from band-pass filter 44 for a first sample time period, a second sample time period, and one or a plurality of subsequent sample time periods, depending upon the needs of the particular application. The resulting sum or sums are employed by controller 46 to determine, using mathematical operations, if an arc fault is presently occurring within electrical system 10.

In some embodiments, a plurality of summed AC voltage samples within a desired sample period is employed by controller 46 to determine an arc fault condition. In other embodiments, pluralities of summed AC voltage samples within corresponding pluralities of sample time periods are employed by controller 46 to determine an arc fault condition, e.g., wherein the difference in summed samples between one sample period and one or more others are employed in making the determination. Some embodiments include making the fault determination solely on the basis of the sampled AC voltage values, i.e., without the use of any DC voltage or current values, and in some embodiments without the use of any mean DC voltage or current values. If a determination is made that an arc fault has occurred, controller 46 sets a flag indicating the occurrence of the arc fault. In some embodiments, controller 46 is configured to execute program instructions to determine whether the arc fault is a persistent fault or a nuisance condition.

Figure 5A:
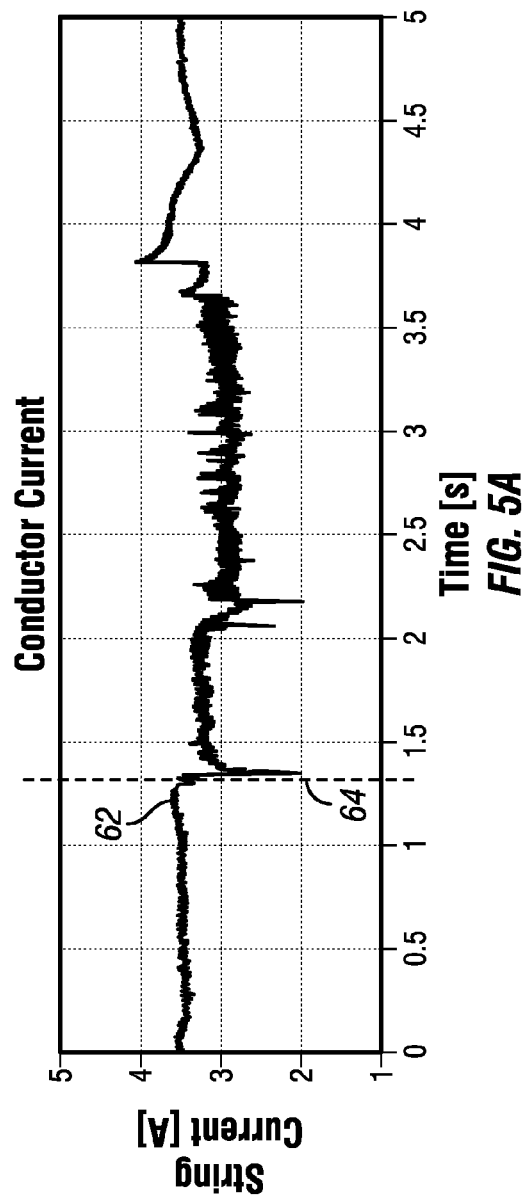
Figure 5B:
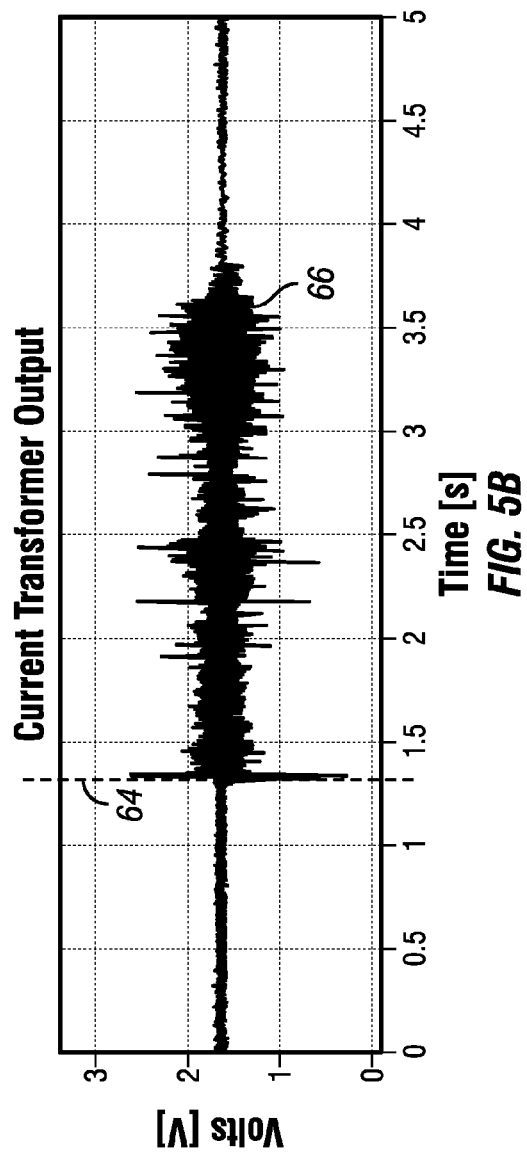

Referring to FIGS. 5A-5C, some aspects of a non-limiting example of outputs of arc detection system 12 in accordance with an embodiment of the present invention are depicted. FIG. 5A illustrates the solar panel 14 string current flow 62 in a conductor, e.g., conductor 32, wherein an arc fault has occurred at a timeline 64 at approximately 1.3 seconds from the start of current measurement. FIG. 5B illustrates the AC signal output 66 of sensor 42 as it senses or measures the current flow in conductor 32. FIG. 5C illustrates the AC voltage output 68 of band-pass filter 44, and illustrates three sample time periods, S1, S2 and S3, in each of which sequential AC voltage values are summed by controller 46. FIG. 5D illustrates the output 70 of controller 46 setting an arc fault flag at a timeline 72 at about 1.45 seconds after the initiation of the arc fault at timeline 64. In the example of FIGS. 5A-5C, controller 46 set the arc fault flag approximately 0.15 seconds after the initiation of the arc fault. The amount of time required to determine an arc fault condition and set the arc fault flag may vary with the needs of the application and with the algorithms employed by the program instructions executed by controller 46.

In some embodiments, controller 46 is configured to execute program instructions to generate a weighted counter. The weighted counter may be constructed to increment a count when the summed AC voltage values exceed a threshold value, and to decrement the count when the summed AC voltage values do not exceed the threshold value. In such embodiments, controller 46 may be configured to execute program instructions to set an arc fault flag in response to the count exceeding a threshold count. The threshold count value may vary with the needs of the application.

In some embodiments, controller 46 is configured to execute program instructions to perform one or more statistical tests on the summed AC voltage values. In some embodiments, controller 46 employs the statistical tests to track a deviation from a non-faulted condition. For example, in some embodiments, controller 46 may be configured to calculate the standard deviation for AC voltage values within a sample time period, and to determine whether the standard deviation exceeds a threshold standard deviation value. In other embodiments, controller 46 may be configured to calculate the standard deviation based on the summed voltages of a plurality of sample time periods, e.g., as between successive sample time periods, and to determine whether the standard deviation exceeds a threshold standard deviation value. In still other embodiments, other statistical tests may be performed.

In some embodiments, controller 46 is configured to execute program instructions to set an initial sample time period; compare the summed AC voltage values during the initial sample time period to a first threshold; and to set an increased sample time period in response to the summed AC voltage values exceeding the first threshold. In some embodiments, controller 46 is configured to execute program instructions, in response to the summed AC voltage values exceeding the first threshold, to compare the summed AC voltage values during the increased sample time period to a second threshold higher than the first threshold; and to set an arc fault flag in response to the summed AC voltage values during the increased sample time period exceeding the second threshold. In still other embodiments, additional thresholds and further increased sample time periods or reduced sample time periods may be employed.

Embodiments of the present invention include an electrical system, comprising: a first electrical component; a second electrical component; a conductor electrically coupling the first electrical component with the second electrical component; a sensor constructed to sense an AC power flow in the conductor and output an AC signal proportional to the AC power flow; a band-pass filter in electrical communication with the sensor and constructed to receive and filter the AC signal and to generate an AC voltage proportional on the AC signal; and a controller in electrical communication with the band-pass filter, the controller being operative to receive and sample the AC voltage from the band-pass filter, and the controller being configured to execute program instructions to sum sequential AC voltage values received from the band-pass filter over a sample time period; and to determine whether an arc fault has occurred based on the summed AC voltage values.

In a refinement, the controller is configured to execute program instructions to generate absolute values of the AC voltage output; and wherein the summed AC voltage values are summed absolute AC voltage values.

In another refinement, the band-pass filter is an analog band-pass filter.

In yet another refinement, the band-pass filter is a three Sallen-Key band-pass filter.

In still another refinement, the band-pass filter is tuned to yield a pass band having multiple peaks.

In yet still another refinement, the controller is configured to execute program instructions to generate a weighted counter, wherein the weighted counter is constructed to increment a count when the summed AC voltage values exceed a threshold value, and to decrement the count when the summed AC voltage values do not exceed the threshold value; and wherein the controller is configured to execute program instructions to set an arc fault flag in response to the count exceeding a threshold count.

In a further refinement, the controller is configured to execute program instructions to perform a statistical test on the summed AC voltage values and to track a deviation from a non-faulted condition.

In a yet further refinement, the controller is configured to execute program instructions to determine whether the arc fault is a persistent fault.

In a still further refinement, the controller is configured to execute program instructions to set an initial sample time period; compare the summed AC voltage values during the initial sample time period to a first threshold; and set an increased sample time period in response to the summed AC voltage values exceeding the first threshold.

In a yet still further refinement, the controller is configured to execute program instructions, in response to the summed AC voltage values exceeding the first threshold, to compare the summed AC voltage values during the increased sample time period to a second threshold higher than the first threshold; and to set an arc fault flag in response to the summed AC voltage values during the increased sample time period exceeding the second threshold.

In another further refinement, the electrical system further comprises a circuit interrupter operative to open-circuit the conductor in response to the controller determining that the arc fault has occurred.

Embodiments of the present invention include a DC photovoltaic system, comprising: a solar panel; a conductor; an inverter in electrical communication with the solar panel via the conductor; a current transformer constructed to sense an AC current in the conductor and output an AC signal proportional to the AC current; a band-pass filter in electrical communication with the current transformer and constructed to receive and filter the AC signal and to generate an AC voltage proportional to the AC signal; and a controller in electrical communication with the band-pass filter, the controller being operative to receive and sample the AC voltage from the band-pass filter, and the controller being configured to execute program instructions to sum sequential AC voltage values received from the band-pass filter over a sample time period; and to determine whether an arc fault has occurred based solely on the summed AC voltage values.

In a refinement, the controller is configured to repeat the summing of the sequential AC voltage values received from the band-pass filter over a plurality of sample time periods.

In another refinement, the controller is configured to execute program instructions to generate a weighted counter, wherein the weighted counter is constructed to increment a count when the summed AC voltage values exceed a threshold value, and to decrement the count when the summed AC voltage values do not exceed the threshold value; and wherein the controller is configured to execute program instructions to set an arc fault flag in response to the count exceeding a threshold count.

In yet another refinement, the controller is configured to execute program instructions to perform a statistical test on the summed AC voltage values and to track a deviation from a non-faulted condition.

In still another refinement, the controller is configured to execute program instructions to determine whether the arc fault is a persistent fault.

In yet still another refinement, the controller is configured to execute program instructions to set an initial sample time period; compare the summed AC voltage values during the initial sample time period to a first threshold; and set an increased sample time period in response to the summed AC voltage values exceeding the first threshold.

In a further refinement, the band-pass filter is a three Sallen-Key band-pass filter; and wherein the band-pass filter is tuned to yield a pass band having multiple peaks.

Embodiments of the present invention include an electrical system, comprising: a first electrical component; a second electrical component; a conductor electrically coupling the first electrical component with the second electrical component; means for sensing an AC power flow in the conductor and for outputting an AC signal proportional to the AC power flow; means for filtering the AC signal and for generating an AC voltage based on the AC signal; means for summing sequential AC voltage values received over a sample time period from the means for filtering; and means for determining whether an arc fault has occurred based on the summed AC voltage values.

In a refinement, the electrical system further comprises means for terminating the arc fault in response to a determination by the means for determining that the arc fault has occurred.

While the invention has been described in connection with what is presently considered to be the most practical and preferred embodiment, it is to be understood that the invention is not to be limited to the disclosed embodiment(s), but on the contrary, is intended to cover various modifications and equivalent arrangements included within the spirit and scope of the appended claims, which scope is to be accorded the broadest interpretation so as to encompass all such modifications and equivalent structures as permitted under the law. Furthermore it should be understood that while the use of the word preferable, preferably, or preferred in the description above indicates that feature so described may be more desirable, it nonetheless may not be necessary and any embodiment lacking the same may be contemplated as within the scope of the invention, that scope being defined by the claims that follow. In reading the claims it is intended that when words such as "a," "an," "at least one" and "at least a portion" are used, there is no intention to limit the claim to only one item unless specifically stated to the contrary in the claim. Further, when the language "at least a portion" and/or "a portion" is used the item may include a portion and/or the entire item unless specifically stated to the contrary.

What is claimed is:

1. An electrical system, comprising:
a first electrical component;
a second electrical component;
a conductor electrically coupling the first electrical component with the second electrical component;
a sensor constructed to sense an AC power flow in the conductor and output an AC signal proportional to the AC power flow;
a band-pass filter in electrical communication with the sensor and constructed to receive and filter the AC signal, wherein the band-pass filter is constructed to pass AC signals at frequencies associated with arcing and to not pass AC signals at other frequencies, and to generate an AC voltage proportional to the AC signals that are passed by the band-pass filter; and
a controller in electrical communication with the band-pass filter, the controller being operative to receive and sample the AC voltage from the band-pass filter, and the controller being configured to sum sequential AC voltage values received from the band-pass filter over a sample time period; and to determine whether an arc fault has occurred based on the summed AC voltage values, wherein the controller is configured to generate a weighted counter, wherein the weighted counter is constructed to increment a count when the summed AC voltage values exceed a threshold value, and to decrement the count when the summed AC voltage values do not exceed the threshold value; and wherein the controller is further configured to set an arc fault flag in response to the count exceeding a threshold count.

2. The electrical system of claim 1, wherein the controller is configured to generate absolute values of the AC voltage output; and wherein the summed AC voltage values are summed absolute AC voltage values.

3. The electrical system of claim 1, wherein the band-pass filter is an analog band-pass filter.

4. The electrical system of claim 3, wherein the band-pass filter is a three Sallen-Key band-pass filter.

5. The electrical system of claim 1, wherein the band-pass filter is tuned to yield a pass band having multiple peaks.

6. The electrical system of claim 1, wherein the controller is configured to perform a statistical test on the summed AC voltage values and to track a deviation from a non-faulted condition.

7. The electrical system of claim 1, wherein the controller is configured to determine whether the arc fault is a persistent fault.

8. The electrical system of claim 1, further comprising a circuit interrupter operative to open-circuit the conductor in response to the controller determining that the arc fault has occurred.

9. An electrical system, comprising:
a first electrical component;
a second electrical component;
a conductor electrically coupling the first electrical component with the second electrical component;
a sensor constructed to sense an AC power flow in the conductor and output an AC signal proportional to the AC power flow;
a band-pass filter in electrical communication with the sensor and constructed to receive and filter the AC signal, wherein the band-pass filter is constructed to pass AC signals at frequencies associated with arcing and to not pass AC signals at other frequencies, and to generate an AC voltage proportional to the AC signals that are passed by the band-pass filter; and
a controller in electrical communication with the band-pass filter, the controller being operative to receive and sample the AC voltage from the band-pass filter, and the controller being configured to sum sequential AC voltage values received from the band-pass filter over a sample time period; and to determine whether an arc fault has occurred based on the summed AC voltage values, wherein the controller is configured to set an initial sample time period; compare the summed AC voltage values during the initial sample time period to a first threshold; and set an increased sample time period in response to the summed AC voltage values exceeding the first threshold.

10. The electrical system of claim 9, wherein the controller is configured to, in response to the summed AC voltage values exceeding the first threshold, compare the summed AC voltage values during the increased sample time period to a second threshold higher than the first threshold; and to set an arc fault flag in response to the summed AC voltage values during the increased sample time period exceeding the second threshold.

11. A DC photovoltaic system, comprising:
a solar panel;
a conductor;
an inverter in electrical communication with the solar panel via the conductor;
a current transformer constructed to sense an AC current in the conductor and output an AC signal proportional to the AC current;
a band-pass filter in electrical communication with the current transformer and constructed to receive and filter the AC signal, wherein the band-pass filter is constructed to pass AC signals at frequencies associated with arcing and to not pass AC signals at other frequencies, and to generate an AC voltage proportional to the AC signals that are passed by the band-pass filter; and
a controller in electrical communication with the band-pass filter, the controller being operative to receive and sample the AC voltage from the band-pass filter, and the controller being configured to sum sequential AC voltage values received from the band-pass filter over a sample time period; and to determine whether an arc fault has occurred based solely on the summed AC voltage values, wherein the controller is configured to generate a weighted counter, wherein the weighted counter is constructed to increment a count when the summed AC voltage values exceed a threshold value, and to decrement the count when the summed AC voltage values do not exceed the threshold value; and wherein the controller is further configured to set an arc fault flag in response to the count exceeding a threshold count.

12. The DC Photovoltaic system of claim 11, wherein the controller is configured to repeat the summing of the sequential AC voltage values received from the band-pass filter over a plurality of sample time periods.

13. The DC photovoltaic system of claim 11, wherein the controller is configured to perform a statistical test on the summed AC voltage values and to track a deviation from a non-faulted condition.

14. The DC photovoltaic system of claim 11, wherein the controller is configured to determine whether the arc fault is a persistent fault.

15. The DC photovoltaic system of claim 11, wherein the band-pass filter is a three Sallen-Key band-pass filter; and wherein the band-pass filter is tuned to yield a pass band having multiple peaks.

16. A DC photovoltaic system, comprising:
a solar panel;
a conductor;
an inverter in electrical communication with the solar panel via the conductor;
a current transformer constructed to sense an AC current in the conductor and output an AC signal proportional to the AC current;
a band-pass filter in electrical communication with the current transformer and constructed to receive and filter the AC signal, wherein the band-pass filter is constructed to pass AC signals at frequencies associated with arcing and to not pass AC signals at other frequencies, and to generate an AC voltage proportional to the AC signals that are passed by the band-pass filter; and
a controller in electrical communication with the band-pass filter, the controller being operative to receive and sample the AC voltage from the band-pass filter, and the controller being configured to sum sequential AC voltage values received from the band-pass filter over a sample time period; and to determine whether an arc fault has occurred based solely on the summed AC voltage values, wherein the controller is configured to set an initial sample time period; compare the summed AC voltage values during the initial sample time period to a first threshold; and set an increased sample time period in response to the summed AC voltage values exceeding the first threshold.

17. An electrical system, comprising:
a first electrical component;
a second electrical component;
a conductor electrically coupling the first electrical component with the second electrical component;
means for sensing an AC power flow in the conductor and for outputting an AC signal proportional to the AC power flow;
means for filtering the AC signal and for generating an AC voltage based on the AC signal, wherein the means for filtering includes a band-pass filter in electrical communication with the means for sensing and the band pass filter is constructed to pass AC signals at frequencies associated with arcing and to not pass AC signals at other frequencies, and to generate an AC voltage proportional to the AC signals that are passed by the band-pass filter;
means for summing sequential AC voltage values received over a sample time period from the means for filtering, wherein the means for summing further sets an initial sample time period, compares the summed AC voltage values during the initial sample time period to a first threshold, and sets an increased sample time period in response to the summed AC voltage values exceeding the first threshold; and
means for determining whether an arc fault has occurred based on the summed AC voltage values.

18. The electrical system of claim 17, further comprising means for terminating the arc fault in response to a determination by the means for determining that the arc fault has occurred.

* * * * *